United States Patent
Fujiwara et al.

(10) Patent No.: US 9,580,331 B2
(45) Date of Patent: Feb. 28, 2017

(54) CAF$_2$ POLYCRYSTALLINE BODY, FOCUS RING, PLASMA PROCESSING APPARATUS, AND METHOD FOR PRODUCING CAF$_2$ POLYCRYSTALLINE BODY

(71) Applicant: NIKON CORPORATION, Tokyo (JP)

(72) Inventors: Seishi Fujiwara, Sagamihara (JP); Naoyasu Uehara, Sagamihara (JP); Yuka Narukawa, Kamakura (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/089,320

(22) Filed: Nov. 25, 2013

(65) Prior Publication Data
US 2014/0079902 A1 Mar. 20, 2014

Related U.S. Application Data

(63) Continuation of application No. PCT/JP2012/063497, filed on May 25, 2012.

(30) Foreign Application Priority Data

May 27, 2011 (JP) ................. 2011-119301

(51) Int. Cl.
*C01F 11/22* (2006.01)
*G02B 1/02* (2006.01)
(Continued)

(52) U.S. Cl.
CPC ............ *C01F 11/22* (2013.01); *C04B 35/553* (2013.01); *C30B 29/12* (2013.01); *G02B 1/02* (2013.01); *C01P 2004/03* (2013.01); *C01P 2004/61* (2013.01); *C04B 2235/3208* (2013.01); *C04B 2235/5436* (2013.01); *C04B 2235/5445* (2013.01); *C04B 2235/604* (2013.01);
(Continued)

(58) Field of Classification Search
CPC ......... C01F 11/22; Y10T 428/218; C23C 8/68
USPC .......................... 423/490; 428/66.6; 118/715
See application file for complete search history.

(56) References Cited

U.S. PATENT DOCUMENTS

2005/0103275 A1  5/2005  Sasaki et al.

FOREIGN PATENT DOCUMENTS

EP   1 460 050 A1   9/2004
JP   3618048        2/2005
(Continued)

OTHER PUBLICATIONS

Taiwanese Office Action dated May 4, 2015 in corresponding Taiwanese Patent Application No. 101118684.
(Continued)

*Primary Examiner* — Brent O'Hern

(57) ABSTRACT

A CaF$_2$ polycrystalline body which is a polycrystalline body constituted of CaF$_2$ and of which an average grain size of crystalline grains is 200 μm or more, and a method for producing a CaF$_2$ polycrystalline body, the method including a process of introducing a compact which is obtained by using a CaF$_2$ powder raw material into a vacuum sintering furnace and sintering at a temperature of not higher than 1400° C. for six hours or more, thereby obtaining the CaF$_2$ polycrystalline body.

8 Claims, 4 Drawing Sheets

(51) Int. Cl.
*C04B 35/553* (2006.01)
*C30B 29/12* (2006.01)

(52) U.S. Cl.
CPC .............. *C04B 2235/6027* (2013.01); *C04B 2235/6567* (2013.01); *C04B 2235/6581* (2013.01); *C04B 2235/77* (2013.01); *C04B 2235/786* (2013.01); *C04B 2235/963* (2013.01); *Y10T 428/218* (2015.01)

(56) References Cited

FOREIGN PATENT DOCUMENTS

| | | |
|---|---|---|
| JP | 2006-206359 | 8/2006 |
| JP | 4158252 | 10/2008 |
| TW | 200304908 | 10/2003 |
| TW | 576823 | 2/2004 |
| TW | 200501253 | 1/2005 |
| WO | WO 01/25001 A1 | 4/2001 |
| WO | WO 0125001 A1 * | 4/2001 ............... B21B 5/16 |

OTHER PUBLICATIONS

International Search Report mailed Aug. 28, 2012 in corresponding International Application No. PCT/JP2012/063497.
PCT Written Opinion of the International Searching Authority mailed Aug. 28, 2012 in corresponding International Patent Application No. PCT/JP2012/063497.
"Testing Method for Grain Size in Microstructure of Fine Ceramics", JIS R1670, 2006, 11 pp.

* cited by examiner

US 9,580,331 B2

CAF₂ POLYCRYSTALLINE BODY, FOCUS RING, PLASMA PROCESSING APPARATUS, AND METHOD FOR PRODUCING CAF₂ POLYCRYSTALLINE BODY

CROSS-REFERENCE TO RELATED APPLICATION

This is a Continuation Application of International Application No. PCT/JP2012/063497, filed May 25, 2012, which claims priority on Japanese Patent Application No. 2011-119301, filed May 27, 2011. The contents of the aforementioned applications are incorporated herein by reference.

BACKGROUND

Field of the Invention

The present invention relates to a member of $CaF_2$ polycrystalline body with excellent corrosion durability.

Background $CaF_2$ single crystal has a high transmittance characteristic of light ranging from ultraviolet region to infrared region and is used as a lens material. $CaF_2$ has lower deliquescent properties and is a more stable fluoride compared with $MgF_2$ and $BaF_2$ fluorides.

In addition, $CaF_2$ has also excellent durability such as fluorine-plasma durability, HF (hydrogen fluoride) durability, chemical durability, and heat durability and therefore $CaF_2$ is available as a plasma-durable member or a crucible member.

However, $CaF_2$ single crystal has cleavability and therefore can be easily cracked by vibration or impact.

In contrast, $CaF_2$ polycrystalline body is superior in that it does not have cleavability as a bulk material because microscopic crystals are bound together to constitute $CaF_2$ polycrystalline body.

On the other hand, it is known that polycrystalline body generally has a grain boundary and the grain boundary surface is preferentially corroded and etched. Therefore, a single crystal which does not have the grain boundary surface is superior from the viewpoint of corrosion durability. Thus, there is a need for a $CaF_2$ member which is poly crystal and yet has improved corrosion durability.

Moreover, superior process-ability is required in order to use as a member.

In order to meet such a need, a member for a semiconductor manufacture apparatus is proposed which is constituted of a high-density fluoride sintered body of which a relative density is 95% or more and an average grain size of crystalline grains is 30 μm or less (for example, refer to Japanese Patent Publication No. 3618048).

SUMMARY

However, the inventors of the present invention have revealed that in the $CaF_2$ polycrystalline body which has been used and disclosed in the related art there is still room for improvement from the viewpoint of corrosion durability.

An object of an aspect of the present invention is to provide $CaF_2$ polycrystalline body with excellent corrosion durability and a method for producing the same.

A first aspect of the present invention is a $CaF_2$ polycrystalline body which is a polycrystalline body constituted of $CaF_2$ and of which an average grain size of crystalline grains is 200 μm or more.

A second aspect of the present invention is a focus ring which is constituted of the $CaF_2$ polycrystalline body according to the first aspect.

A third aspect of the present invention is a plasma processing apparatus which is provided with the focus ring according to the second aspect.

A fourth aspect of the present invention is a method for producing a $CaF_2$ polycrystalline body, the method including a process of introducing a compact which is obtained by using a $CaF_2$ powder raw material into a vacuum sintering furnace and sintering at a temperature of not higher than 1400° C. for six hours or more, thereby obtaining the $CaF_2$ polycrystalline body.

A $CaF_2$ polycrystalline body according to an aspect of the present invention has corrosion durability which is comparable to that of $CaF_2$ single crystal and therefore is effectively used as a plasma-durable member, a crucible member, or the like. Moreover, according to the $CaF_2$ polycrystalline body of an aspect of the present invention, because there are few vacancies and few residual particles, cutting oil or the like is not absorbed and thus the process-ability is excellent.

In addition, according to a method for producing a $CaF_2$ polycrystalline body of an aspect of the present invention, it is possible to provide a $CaF_2$ polycrystalline body having the features described above.

DESCRIPTION OF THE EMBODIMENTS

Hereinafter, embodiments of the present invention will be described in detail. Note that, these embodiments are specifically described for better understanding of the scope of the present invention, and the present invention is not limited thereto, unless otherwise specified.

A $CaF_2$ polycrystalline body according to the present embodiment is a polycrystalline body which is constituted of $CaF_2$, and the average grain size of crystalline grains is 200 μm or more.

Figure 3:
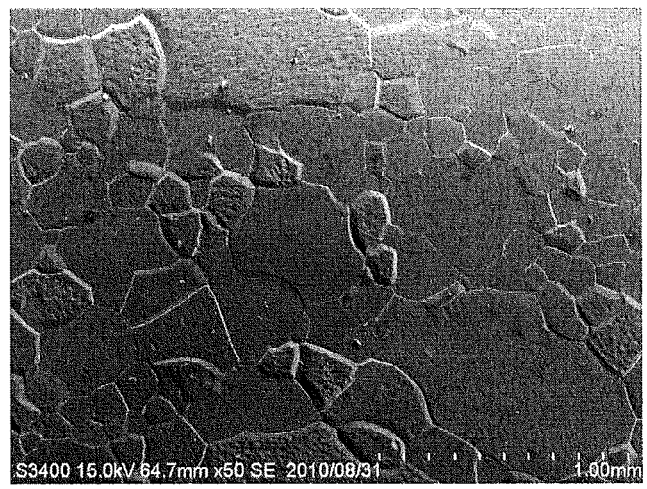
FIG. 3 is a SEM (Scanning Electron Microscope) image (50-fold) of a polycrystalline body sample according to Example 2.
Figure 4:
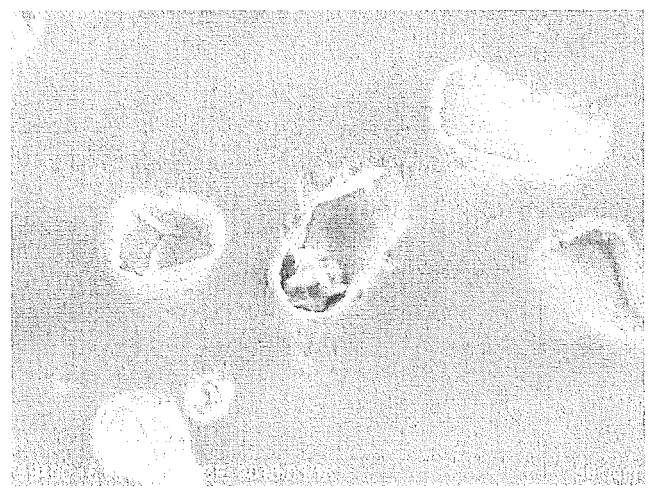
FIG. 4 is a SEM (Scanning Electron Microscope) image (1000-fold) of a polycrystalline body sample according to Comparative Example 1.

In the $CaF_2$ polycrystalline body according to the present embodiment, the relative density can be 94.0% or more and is preferably 99.0% or more in order to have superior process-ability. FIG. 3 is a SEM (Scanning Electron Microscope) image of a $CaF_2$ polycrystalline body with a relative density of 94.0% or more (99.69%), and FIG. 4 is a SEM (Scanning Electron Microscope) image of a $CaF_2$ polycrystalline body with a relative density of less than 94.0% (93.71%).

The relative density of the $CaF_2$ polycrystalline body can be obtained by measuring the density of the $CaF_2$ polycrystalline body using Archimedes' Principle and expressing the ratio of the density of the $CaF_2$ polycrystalline body to the density of a $CaF_2$ single crystal as a percentage.

As is shown in FIG. 3, neither vacancies nor residual particles are observed in the $CaF_2$ polycrystalline body according to the present embodiment. On the other hand, as is shown in FIG. 4, in the case that the relative density is less than 94.0%, vacancies and residual particles are observed. The $CaF_2$ polycrystalline body, due to such vacancies or residual particles, absorbs cutting oil or water at the time of processing.

In addition, in the case that the relative density is less than 94.0%, because the contact surface in contact with a corrosive material is increased, the corrosion durability is also negatively affected.

In the $CaF_2$ polycrystalline body according to the present embodiment, the average grain size of the crystalline grains (crystalline grain size) is 200 µm or more. In the present embodiment, it is clarified that corrosion durability is enhanced with the increase of the crystalline grain size and that, when the crystalline grain size becomes 200 µm or more, the corrosion durability reaches a region of saturation.

It is considered that the reason why corrosion durability is enhanced with the increase of the crystalline grain size is that the interface which is easy to be etched is reduced with the increase of the crystalline grain size. This is because the crystal interface is preferentially etched. In addition, it is understood that corrosion durability of the $CaF_2$ polycrystalline body of the present embodiment is close to that of $CaF_2$ single crystal. Thus, the $CaF_2$ polycrystalline body of the present embodiment combines an advantage of polycrystalline body which does not have cleavability with an advantage of single crystal body which has superior corrosion durability.

As is described above, the $CaF_2$ polycrystalline body of the present embodiment has excellent process-ability and excellent corrosion durability. Note that, $CaF_2$ which constitutes the above-described polycrystalline body may include an impurity element as much as the crystalline quality and corrosion durability of the $CaF_2$ polycrystalline body are not negatively affected.

A method for producing a $CaF_2$ polycrystalline body of the present embodiment has a process of introducing a compact which is obtained by using a $CaF_2$ powder raw material into a vacuum sintering furnace and sintering at a temperature of not higher than 1400° C. for six hours or more, thereby obtaining the $CaF_2$ polycrystalline body.

The particle size (median size) of the $CaF_2$ powder raw material can be 3 µm or less and is preferably 0.5 µm or less. In the case that the size of the $CaF_2$ powder raw material is large, it is possible to crush it into pieces by ball milling or the like in advance of use.

By using the above-described $CaF_2$ powder raw material, forming is performed by using a CIP (Cold Isostatic Press) method, a casting method, a vibration filling method, or the like.

The CIP method is a method in which the $CaF_2$ powder raw material is preliminarily formed by mold press, and the preliminary compact is vacuum-packed and then is set in a CIP apparatus where pressure holding is performed at a predetermined pressure (for example, 50 to 200 MPa) and for a predetermined length of time (for example, 1 to 10 minutes), thereby preparing a compact. For example, pressure holding may be performed at a pressure of 100 MPa for 1 minute to prepare the compact.

The casting method is a method in which slurry that is prepared by mixing the $CaF_2$ powder raw material and water is cast into a plaster mold and, for example, is maintained stationary at room temperature for 48 hours or more to obtain a compact, and then the compact is removed from the plaster mold and is dried in a drying furnace at a predetermined temperature (for example, 30 to 90° C.) for a predetermined length of time (for example, 3 to 240 hours). For example, the compact may be dried at a condition of 80° C. and 48 hours.

The vibration filling method is a method in which the $CaF_2$ raw material powder is filled into a carbon mold and then set in a vibrating machine where, for example, vibration filling is performed at predetermined amplitude (for example, 1 to 6 mm), at a predetermined vibration frequency (for example, 20 to 120 Hz), and for predetermined vibration time (for example, 5 to 120 sec), thereby preparing a compact. For example, vibration filling may be performed at a condition of amplitude of 4.6 mm, a vibration frequency of 40 Hz, and vibration time of 60 sec.

A compact which is formed by the above-described forming method is introduced into a vacuum sintering furnace and sintered. The sinter process is performed in a vacuum atmosphere, and the degree of vacuum can be 10 Pa or less for the purpose of densification and prevention of oxidation of $CaF_2$.

In the sinter process, the compact is sintered for 6 hours or more at a temperature of 1400° C. or less, which is a temperature that is not higher than the melting point of $CaF_2$. When the sintering temperature is higher and the sintering time is longer, the crystalline grain size of the prepared polycrystalline body tends to become larger. However, there are disadvantages such as the decrease of weight of the polycrystalline body due to volatilization of the compact and the increase of production lead time. Therefore, the sintering temperature is 1400° C. or less and is preferably 1250 to 1350° C. In addition, the sintering time is 6 hours or more and is preferably 24 hours or less.

By the above-described production method, a $CaF_2$ polycrystalline body having a relative density of 94.0% or more and an average grain size of crystalline grains of 200 µm or more is obtained. In order to additionally improve corrosion durability of the obtained $CaF_2$ polycrystalline body, mirror polishing is performed such that the surface roughness (Ra) can be 1 µm or less, preferably 0.5 µm or less, and more preferably 0.1 µm or less.

The $CaF_2$ polycrystalline body of the present embodiment is excellent in corrosion durability and process-ability and therefore is effectively used as an inner wall member of a semiconductor manufacture apparatus such as a plasma processing apparatus or a focus ring. The focus ring is a member which is provided at the circumference of a processed object in order to reduce the non-uniformity of etching rate of the processed object which arises from non-uniform plasma distribution when the processed object is plasma-etched in a plasma processing apparatus.

Hereinafter, a focus ring which is constituted of $CaF_2$ polycrystalline body of the present embodiment and a plasma processing apparatus having the focus ring are described with reference to FIGS. 5A, 5B, and FIG. 6.

Figure 5A:
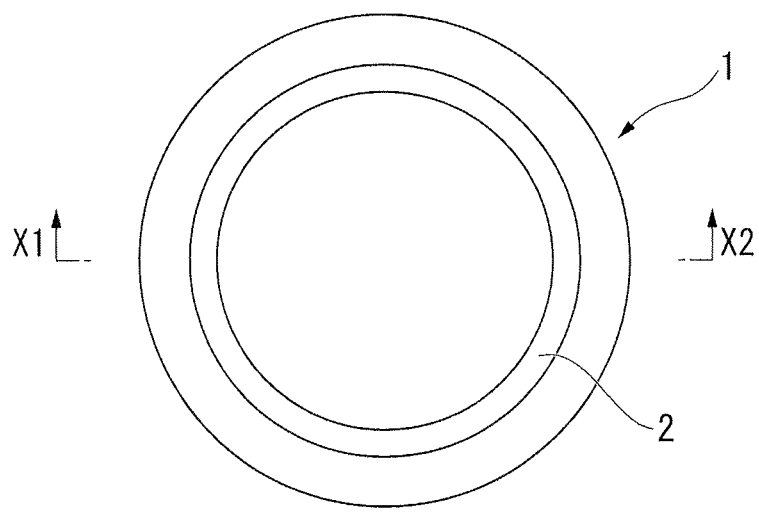
FIG. 5A is a schematic diagram showing a top view of a focus ring which is constituted of $CaF_2$ polycrystalline body according to an embodiment.
Figure 5B:
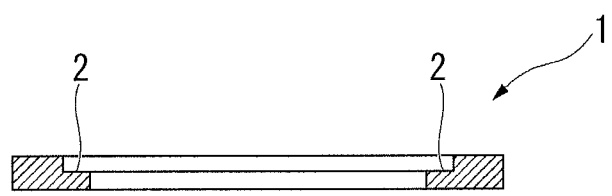
FIG. 5B is a schematic diagram of a focus ring which is constituted of $CaF_2$ polycrystalline body according to an embodiment and is a diagram showing a cross-section view of FIG. 5A along the line X1-X2.

FIGS. 5A and 5B are schematic diagrams of the focus ring which is constituted of $CaF_2$ polycrystalline body according to the present embodiment. FIG. 5A shows a top view of the focus ring, and FIG. 5B shows a cross-section view of the focus ring of FIG. 5A along the line X1-X2.

A focus ring 1 which is shown in FIGS. 5A and 5B is formed in a circular shape and is in a shape having a step portion 2 at an inner circumferential portion of the focus ring 1. The focus ring 1 having such a configuration is used such that the inner circumferential portion surrounds the processed object.

Figure 6:
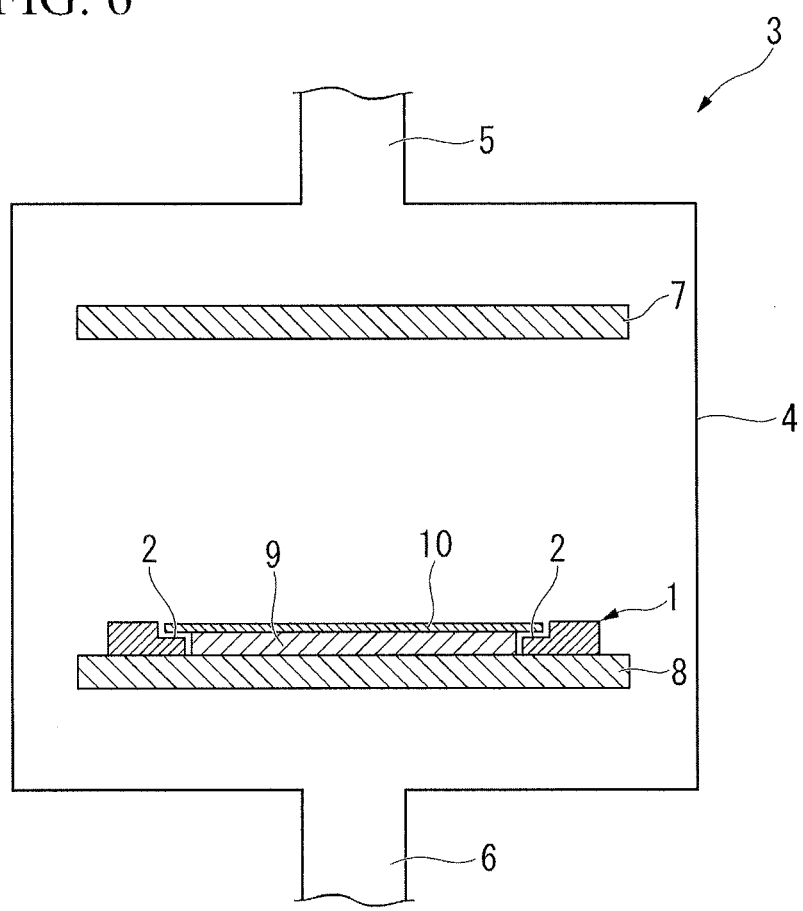
FIG. 6 is a schematic diagram of a plasma processing apparatus which is provided with a focus ring constituted of $CaF_2$ polycrystalline body according to an embodiment.

FIG. 6 is a schematic diagram of a plasma processing apparatus having the focus ring 1 which is shown in FIGS. 5A and 5B.

A plasma processing apparatus 3 shown in FIG. 6 is provided with a top electrode 7 and a bottom electrode 8 within a chamber 4 having a gas supply port 5 and a gas discharge port 6. In addition, the top surface of the bottom electrode 8 is provided with the focus ring 1 shown in FIGS. 5A and 5B and an electrostatic chuck 9 so as to support a processed object 10. The electrostatic chuck 9 is arranged to be surrounded by the focus ring 1, and by placing the processed object 10 on the electrostatic chuck 9, the circumference of the processed object 10 is surrounded by the focus ring 1.

In order to plasma-etch the processed object 10 by using the plasma processing apparatus 3 of such a configuration, firstly, etching gas is supplied from the gas supply port 5 while the chamber 4 is evacuated, and a radiofrequency voltage is applied to the top electrode 7 and the bottom electrode 8. Thereby, the etching gas is made to be plasma by a radiofrequency electric field which is formed between the top electrode 7 and the bottom electrode 8. Then, etching of the processed object 10 is performed by this plasma.

During the plasma etching of the processed object 10 is performed as described above, the focus ring 1 is also exposed to the plasma as is the case with the processed object 10. For this reason, it is required to use a material having corrosion durability as the material of the focus ring 1. As is described above, the $CaF_2$ polycrystalline body of the present embodiment has excellent corrosion durability and therefore can be suitably used as the material of the focus ring 1 which is exposed to plasma as is shown in FIGS. 5A and 5B and FIG. 6.

Example 1

Hereinafter, Examples of the present invention will be specifically described. However, the present invention is not limited to the Examples described below.

Preparation of Sample

Reference Example

By using the method disclosed in Japanese Patent Publication No. 4158252, $CaF_2$ powder raw material was melted and solidified to obtain an ingot of $CaF_2$ single crystal. Then, cutting and grinding process of the ingot were performed by using a cutting machine and a grinding machine, and test pieces having a sample size of 20 mm×20 mm×2 mm were cut out. Note that, at the time of the cutting and grinding process, cutting oil or water was used in order to facilitate the process. Then, both surfaces of the sample were mirror-polished, and the surface roughness (Ra) was made to be 0.1 μm or less. Thus, $CaF_2$ single crystal of Reference Example having crystal orientation of <111> directed toward the top surface of the sample surface was obtained.

Examples 1 to 4, Comparative Examples 1 to 5

$CaF_2$ powder raw material having a median size of 32.7 μm was prepared. Crushing process by ball milling was applied to this material, and raw materials having a median size of 2.4 μm, 2.7 μm, and 3.1 μm were prepared. In addition, by using the method disclosed in Japanese Unexamined Patent Application, First Publication No. 2006-206359, $CaF_2$ fine particles having a median size of 0.5 μm were prepared. The $CaF_2$ fine particles were produced by reacting an aqueous solution of calcium acetate and an aqueous solution of hydrogen fluoride to obtain a solution in which fine particles of calcium fluoride were suspended, loading the solution in which fine particles of calcium fluoride were suspended into a closed vessel, performing heating at a temperature of not lower than 100° C. and not higher than 300° C., and drying the heated suspension of fine particles of calcium fluoride at a temperature of not lower than room temperature and not higher than 70° C.

By using these materials, forming was performed.

The forming was performed by using any one of the CIP (Cold Isostatic Press) method, the casting method, and the vibration filling method, as the forming method.

In the CIP method, powder was preliminarily formed by mold press, and the preliminary compact was vacuum-packed. Then, the preliminary compact was set in a CIP apparatus, and pressure holding was performed at a pressure of 100 MPa for 1 minute. Thus, a compact was prepared.

In the casting method, $CaF_2$ raw material and water were mixed and thereby slurry was prepared. The obtained slurry was cast into a plaster mold and was maintained stationary at room temperature for 48 hours or more to obtain a compact. Then, the obtained compact was removed from the plaster mold and was loaded in a drying furnace, where the compact was dried at a temperature of 80° C. for 48 hours. Thus, the compact was prepared.

In the vibration filling method, $CaF_2$ raw material powder was filled into a carbon mold and then was set in a vibrating machine where vibration filling was performed at amplitude of 4.6 mm and a vibration frequency of 40 Hz for vibration time of 60 sec. Thereby, a compact was prepared.

The compact which was formed by using the above-described forming method was introduced into a vacuum sintering furnace and was sintered at a condition shown in Table 1.

The obtained polycrystalline body was cut into samples having a sample size of 20 mm×20 mm×2 mm as is the case with the above-described Reference Example. Then, both surfaces of the sample were mirror-polished, and the surface roughness (Ra) was made to be 0.1 μm or less. Thus, $CaF_2$ poly crystal of Examples 1 to 4 and Comparative Examples 1 to 5 was prepared.

Following evaluations were made using $CaF_2$ single crystal of Reference Example and $CaF_2$ poly crystal of Examples 1 to 4 and Comparative Examples 1 to 5, which were prepared as described above. Results were shown in Table 1.

Bulk Density, Relative Density

Density measurements were performed by Archimedes' Principle. Electric balance AUX320 provided by Shimadzu Corporation was used as the measurement machine. The percentage relative to the density of 3.18 g/cm³ of $CaF_2$ single crystal of Reference Example was defined as the relative density.

Crystalline Grain Size

Measurements of crystalline grain size of the polycrystalline body were performed by observing crystalline grains using scanning electron microscope (SEM). As the pretreatment for measurements, the sample was dipped in 60% perchloric solution (Wako Pure Chemical Industries, Ltd.) at room temperature for 24 hours. Then, the sample was rinsed by pure water and dried, and Pt—Pd coating was applied to the sample. The SEM observation was performed in a reflected electron image mode and was performed at 50-fold or 1000-fold magnification, depending on the size of the crystalline grain size. Any three fields of view were observed in one sample. The long axis and the short axis of crystalline grains within each field of view were measured, and the average was made to be crystalline grain size (average grain size). The measurement of the axis conformed to JISR1670, "Measurement method of grain size of fine ceramics". Note that, regarding Reference Example, because it was formed as single crystal, the column of crystalline grain size in Table 1 was filled with "No grain boundary".

Etching Rate, Durability

The prepared polished sample was dipped in 60% perchloric solution at a temperature of 80° C. for 1 hour. The thickness of the sample before and after dipping was measured, and the difference between the thickness of the sample before dipping and the thickness of the sample after dipping was divided by process time. The result of calculation was made to be etching rate. For the thickness measurement of the sample, Digital micrometer ME50HA (provided by NIKON) was used.

The sample having an etching rate of 10 μm/hr or less was judged as "Good", while the sample having an etching rate exceeding 10 μm/hr was judged as "No-good".

Process-Ability

When a test piece having a sample size of 20 mm×20 mm×2 mm was cut out, a determination of "Good" was made in the case that absorption of cutting oil or water was not observed, while a determination of "No-good" was made in the case that absorption of cutting oil or water was observed.

TABLE 1

| SAMPLE No. | EXAMPLE | STRUCTURE | MEDIAN SIZE OF RAW MATERIAL POWDER (μm) | FORMING METHOD | SINTERING TEMPERATURE (° C.) | SINTERING TIME (hr) |
|---|---|---|---|---|---|---|
| 1 | REFERENCE EXAMPLE | SINGLE CRYSTAL | | | | |
| 2 | EXAMPLE 1 | POLY CRYSTAL | 0.5 | CIP | 1250 | 12 |
| 3 | EXAMPLE 2 | POLY CRYSTAL | 0.5 | CIP | 1250 | 6 |
| 4 | EXAMPLE 3 | POLY CRYSTAL | 2.7 | CASTING | 1350 | 6 |
| 5 | EXAMPLE 4 | POLY CRYSTAL | 2.7 | CASTING | 1350 | 24 |
| 6 | COMPARATIVE EXAMPLE 1 | POLY CRYSTAL | 32.7 | VIBRATION FILLING | 1250 | 12 |
| 7 | COMPARATIVE EXAMPLE 2 | POLY CRYSTAL | 3.1 | CIP | 1250 | 3 |
| 8 | COMPARATIVE EXAMPLE 3 | POLY CRYSTAL | 2.4 | CIP | 1250 | 3 |
| 9 | COMPARATIVE EXAMPLE 4 | POLY CRYSTAL | 2.7 | CASTING | 1250 | 3 |
| 10 | COMPARATIVE EXAMPLE 5 | POLY CRYSTAL | 2.7 | CASITNG | 1250 | 3 |

| SAMPLE No. | BULK DENSITY (g/cm³) | RELATIVE DENSITY (%) | CRYSTALLINE GRAIN SIZE (μm) | ETCHING RATE (μm/hr) | PROCESS-ABILITY | DURABILITY |
|---|---|---|---|---|---|---|
| 1 | 3.18 | 100.00 | NO GRAIN BOUNDARY | 4.5 | | |
| 2 | 3.18 | 100.00 | 360.8 | 8.5 | GOOD | GOOD |
| 3 | 3.17 | 99.69 | 252.3 | 9.0 | GOOD | GOOD |
| 4 | 3.15 | 99.06 | 420.8 | 10 | GOOD | GOOD |
| 5 | 3.17 | 99.69 | 705.3 | 7 | GOOD | GOOD |
| 6 | 2.98 | 93.71 | 233.3 | 7.5 | NO-GOOD | GOOD |
| 7 | 3.14 | 98.74 | 92.7 | 17.5 | GOOD | NO-GOOD |
| 8 | 3.17 | 99.69 | 123.7 | 26.5 | GOOD | NO-GOOD |
| 9 | 3.15 | 99.06 | 91.0 | 39.5 | GOOD | NO-GOOD |
| 10 | 3.10 | 97.48 | 88.0 | 24.2 | GOOD | NO-GOOD |

As is shown in Table 1, in the $CaF_2$ polycrystalline body of Comparative Example 1 having a relative density of less than 94.0%, grinding (cutting) oil, water, or the like was absorbed at the time of process, and thus a difficulty was found in the process-ability.

In addition, in the $CaF_2$ polycrystalline body of Comparative Examples 2 to 5 having a crystalline grain size (average grain size of crystalline grains) of the polycrystalline body of less than 200 μm, etching rates exceeded 10 μm/hr, and thus inferior durability was confirmed.

Figure 1:
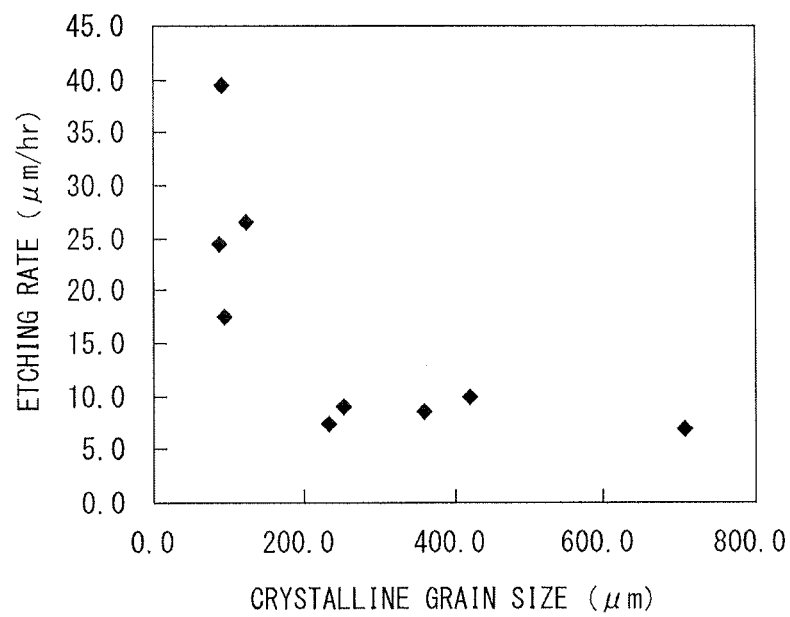
FIG. 1 is a relationship diagram between a crystalline grain size (average grain size of crystalline grains) and an etching rate, of a polycrystalline body according to Examples and Comparative Examples.

Moreover, on the basis of the results shown in Table 1, the relation between the crystalline grain size (average grain size of crystalline grains) and the etching rate with respect to the polycrystalline body was shown in FIG. 1. It was found from FIG. 1 that, as the crystalline grain size was increased, the etching rate was reduced and corrosion durability was enhanced. It was generally known that the crystal interface was preferentially etched. Therefore, it was considered that the reason for the results in FIG. 1 was that the interface which was easy to be etched was reduced with the increase of the crystalline grain size. In the present invention, it was found that corrosion durability was in a saturation range when the crystalline grain size was 200 μm or more. It was estimated that, because the etching rate of single crystal was 4.5 μm/hr, the fitted curve became close to this value.

Figure 2:
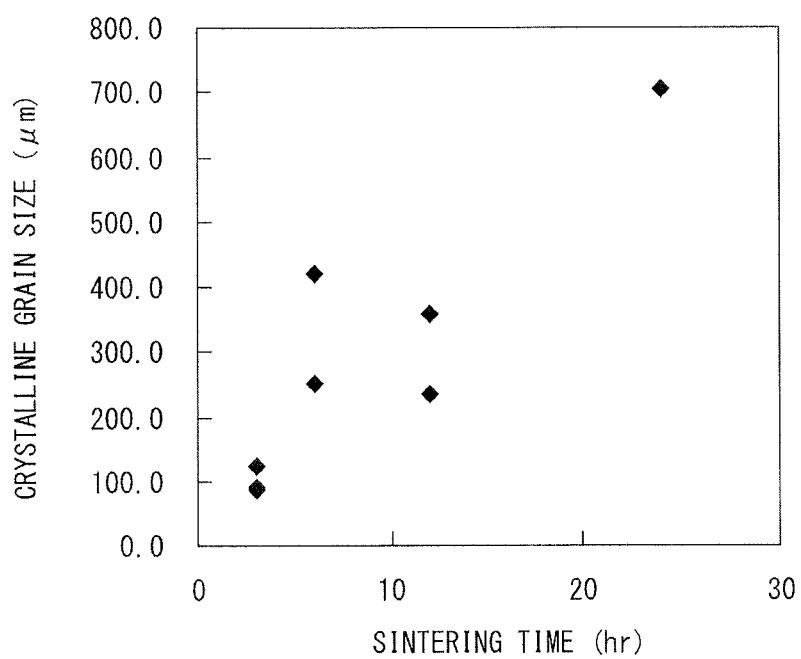
FIG. 2 is a relationship diagram between sintering time and a crystalline grain size (average grain size of crystalline grains), of a polycrystalline body according to Examples and Comparative Examples.

Next, on the basis of the results shown in Table 1, the relation between the sintering time and the crystalline grain size (average grain size of crystalline grains) with respect to the polycrystalline body was shown in FIG. 2. As is shown in FIG. 2, the crystalline grain size depended on the sintering time, and the crystalline grain size tended to be increased with the increase of the sintering time. It was confirmed that crystalline grain size of 200 μm or more was able to be achieved by sintering for 6 hours or more.

From the above-identified results, according to the present invention, it is clearly possible to provide a $CaF_2$ polycrystalline body having excellent corrosion durability and excellent process-ability and a method for producing the same.

Availability for Industrial Application

According to the present invention, it is possible to provide a $CaF_2$ polycrystalline body of which corrosion durability and process-ability are excellent and a method for producing the same. By using the $CaF_2$ polycrystalline body of the present invention, durability of a member which is used at a condition of being exposed to plasma, such as a focus ring, can be improved.

What is claimed is:

1. A $CaF_2$ polycrystalline body which is a polycrystalline body constituted of $CaF_2$ and of which an average grain size of crystalline grains is 200 μm or more.

2. The $CaF_2$ polycrystalline body according to claim 1, wherein a relative density is 94.0% or more.

3. A focus ring which is constituted of the $CaF_2$ polycrystalline body according to claim 1.

4. A plasma processing apparatus which is provided with the focus ring according to claim 3.

5. A method for producing the $CaF_2$ polycrystalline body according to claim 1, the method including a process of introducing a compact which is obtained by using a $CaF_2$ powder raw material into a vacuum sintering furnace and sintering at a temperature of not higher than 1400° C. for six hours or more, thereby obtaining the $CaF_2$ polycrystalline body.

6. A focus ring which is constituted of the $CaF_2$ polycrystalline body according to claim 2.

7. A plasma processing apparatus which is provided with the focus ring according to claim 6.

8. A method for producing the $CaF_2$ polycrystalline body according to claim 2, the method including a process of introducing a compact which is obtained by using a $CaF_2$ powder raw material into a vacuum sintering furnace and sintering at a temperature of not higher than 1400° C. for six hours or more, thereby obtaining the $CaF_2$ polycrystalline body.

* * * * *

UNITED STATES PATENT AND TRADEMARK OFFICE
CERTIFICATE OF CORRECTION

PATENT NO. : 9,580,331 B2  Page 1 of 1
APPLICATION NO. : 14/089320
DATED : February 28, 2017
INVENTOR(S) : Fujiwara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 101 days.

Signed and Sealed this
Twenty-fifth Day of September, 2018

Andrei Iancu
*Director of the United States Patent and Trademark Office*